United States Patent
Sasaki

(10) Patent No.: US 7,279,217 B2
(45) Date of Patent: Oct. 9, 2007

(54) MULTILAYER CERAMIC DEVICE, METHOD FOR MANUFACTURING THE SAME, AND CERAMIC DEVICE

(75) Inventor: Satoshi Sasaki, Akita (JP)

(73) Assignee: TDK Corporation, Tokyo (JP)

( * ) Notice: Subject to any disclaimer, the term of this patent is extended or adjusted under 35 U.S.C. 154(b) by 80 days.

(21) Appl. No.: 11/131,203

(22) Filed: May 18, 2005

(65) Prior Publication Data

US 2006/0003151 A1    Jan. 5, 2006

(30) Foreign Application Priority Data

May 24, 2004  (JP) ............................. 2004-153793
Jul. 1, 2004   (JP) ............................. 2004-195965

(51) Int. Cl.
  *B32B 3/00*    (2006.01)
  *H05K 1/03*    (2006.01)
  *C03B 29/00*   (2006.01)

(52) U.S. Cl. ...................... 428/210; 428/209; 174/257; 156/89.12

(58) Field of Classification Search ................ 428/210, 428/209, 901; 156/89.12; 174/257
See application file for complete search history.

(56) References Cited

U.S. PATENT DOCUMENTS

| | | | | |
|---|---|---|---|---|
| 4,650,923 A | * | 3/1987 | Nishigaki et al. | 174/257 |
| 4,732,798 A | * | 3/1988 | Ishida et al. | 428/137 |
| 4,795,670 A | * | 1/1989 | Nishigaki et al. | 428/209 |
| 5,362,551 A | * | 11/1994 | Okamoto et al. | 428/210 |
| 5,439,732 A | * | 8/1995 | Nagasaka et al. | 428/210 |
| 5,456,778 A | * | 10/1995 | Fukuta et al. | 156/89.17 |
| 5,503,777 A | * | 4/1996 | Itagaki et al. | 252/519.21 |
| 5,514,451 A | * | 5/1996 | Kumar et al. | 428/210 |
| 5,688,441 A | * | 11/1997 | Itagaki et al. | 252/514 |
| 5,757,062 A | * | 5/1998 | Ikuina et al. | 257/537 |
| 6,133,535 A | * | 10/2000 | Banba et al. | 174/257 |
| 6,432,239 B1 | * | 8/2002 | Mandai et al. | 156/89.12 |
| 6,594,892 B2 | * | 7/2003 | Ohya et al. | 29/846 |
| 6,762,369 B2 | * | 7/2004 | Saito et al. | 174/262 |
| 7,095,602 B1 | * | 8/2006 | Kimura | 361/306.3 |

FOREIGN PATENT DOCUMENTS

JP    A 2002-254634    9/2002

* cited by examiner

*Primary Examiner*—Cathy F. Lam
(74) *Attorney, Agent, or Firm*—Oliff & Berridge, PLC

(57) ABSTRACT

There is provided a multilayer ceramic device enabling achievement of secure electric connection via electroconductive members in through holes and reduction in the thickness of internal electrodes during manufacturing. In multilayer piezoelectric device 1, a melting point of a material of the electroconductive members in the through holes is higher than a melting point of a material of the internal electrodes 2 and others. For this reason, the electroconductive members in the through holes have a contraction percentage in baking smaller than that of the internal electrodes 2 and others. Therefore, contraction of the electroconductive members is relatively constricted in baking, so as to decrease the difference of contraction percentages in baking between green sheets intended for piezoelectric layers 3 and others, and the electroconductive members in the through holes. This results in preventing breakage of the electrical connection via the electroconductive members in the through holes. On the other hand, contraction of the internal electrodes 2 and others is relatively promoted in baking, so as to make the internal electrodes 2 and others thinner by baking.

11 Claims, 7 Drawing Sheets

MULTILAYER CERAMIC DEVICE, METHOD FOR MANUFACTURING THE SAME, AND CERAMIC DEVICE

BACKGROUND OF THE INVENTION

1. Field of the Invention

The present invention relates to a multilayer ceramic device, such as a multilayer piezoelectric device or a multilayer capacitor, and a method for manufacturing the same, and to a ceramic device.

2. Related Background Art

One of the conventional multilayer ceramic devices is, for example, a multilayer piezoelectric device described in Japanese Patent Application Laid-Open No. 2002-254634. In this multilayer piezoelectric device, piezoelectric layers with a plurality of individual electrodes formed in a pattern, and piezoelectric layers with a common electrode formed in a pattern are alternately stacked, and individual electrodes aligned in the stack direction are connected by electroconductive members via through holes formed in the piezoelectric layers.

In this piezoelectric device, lead wires for connection to a drive power supply are soldered to respective terminal electrodes formed on the uppermost piezoelectric layer. When a voltage is applied through the lead wires between a predetermined individual electrode and the common electrode, active parts (portions to become distorted by piezoelectric effect) corresponding to the predetermined individual electrode in the piezoelectric layers are selectively displaced.

SUMMARY OF THE INVENTION

Incidentally, the multilayer ceramic devices such as the piezoelectric devices as described above are demanded to achieve higher certainty of electric connection through the electroconductive members in the through holes formed in the ceramic layers, during the manufacturing the same. At the same time, they are also demanded to achieve further reduction in the thickness of the internal electrodes, such as the individual electrodes, in terms of size reduction of the multilayer ceramic devices or the like.

The present invention has been accomplished in view of such circumstances, and an object of the present invention is to provide a multilayer ceramic device and a method for manufacturing the same enabling achievement of secure electric connection through the electroconductive members in the through holes and reduction in the thickness of the internal electrodes during manufacturing, and to provide a ceramic device.

The Inventors conducted elaborate research in order to accomplish the above object, and discovered that breakage of the electrical connection through the electroconductive members in the through holes during manufacturing of the multilayer ceramic device was caused by the difference of contraction percentages in baking between ceramic source bodies intended for ceramic layers, and the electroconductive members in the through holes. Namely, since the electroconductive members in the through holes have the contraction percentage in baking greater than that of the ceramic source bodies intended for the ceramic layers, the electroconductive members tend to deviate to one side or break apart on the way in the through holes, so as to result in breaking the electric connection through the electroconductive members in the through holes. The Inventors conducted further research on the basis of this expertise, and accomplished the present invention.

Namely, a multilayer ceramic device according to the present invention is a multilayer ceramic device consisting of a stack of ceramic layers, the multilayer ceramic device comprising: an electroconductive member set in a through hole formed in the ceramic layers; and an internal electrode formed between the ceramic layers adjacent to each other, wherein a melting point of a material forming the electroconductive member is higher than a melting point of a material forming the internal electrode.

In this multilayer ceramic device, the melting point of the material forming the electroconductive member is higher than that of the material forming the internal electrode, whereby the electroconductive member has the contraction percentage in baking smaller than that of the internal electrode. This results in relatively constricting the contraction of the electroconductive member in baking, so as to decrease the difference of contraction percentages in baking between the ceramic source bodies intended for the ceramic layers, and the electroconductive member in the through hole. As a result, the electroconductive member is prevented from deviating to one side in the through hole or from breaking apart on the way during the baking, and it then prevents the breakage of electric connection through the electroconductive member in the through hole. On the other hand, contraction of the internal electrode is relatively promoted in baking, so as to make the internal electrode thinner by baking. Therefore, this multilayer ceramic device successfully achieves secure electric connection through the electroconductive member in the through hole and reduction in the thickness of the internal electrode during manufacturing.

In the multilayer ceramic device according to the present invention, preferably, each of the electroconductive member and the internal electrode is made of a material containing at least one of silver and gold, and palladium, and a proportion of palladium in the material forming the electroconductive member is higher than a proportion of palladium in the material forming the internal electrode. Since the melting point of palladium (Pd) is higher than those of silver (Ag) and gold (Au), the melting point of the material forming the electroconductive member can be made higher than that of the material forming the internal electrode, by setting the proportion of Pd in the material forming the electroconductive member higher than the proportion of Pd in the material forming the internal electrode.

In the multilayer ceramic device according to the present invention, preferably, each of the electroconductive member and the internal electrode is made of a material containing at least one of silver and gold, and platinum, and a proportion of platinum in the material forming the electroconductive member is higher than a proportion of platinum in the material forming the internal electrode. Since the melting point of platinum (Pt) is higher than those of silver (Ag) and gold (Au), the melting point of the material forming the electroconductive member can be made higher than that of the material forming the internal electrode, by setting the proportion of Pt in the material forming the electroconductive member higher than the proportion of Pt in the material forming the internal electrode.

Furthermore, a method for manufacturing a multilayer ceramic device according to the present invention is a method for manufacturing a multilayer ceramic device consisting of a stack of ceramic layers, the method comprising: a step of setting an electroconductive member in a through hole formed in a ceramic source body intended for the ceramic layer, and forming an internal electrode on a surface of the ceramic source body; a step of stacking a plurality of such ceramic source bodies each with the electroconductive member set therein and with the internal electrode formed thereon, to form a ceramic laminate; and a step of baking the ceramic laminate, wherein a melting point of a material forming the electroconductive member is higher than a melting point of a material forming the internal electrode, and wherein the melting point of the material forming the internal electrode is higher than a temperature at which the ceramic laminate is baked.

In this method for manufacturing the multilayer ceramic device, the melting point of the material forming the electroconductive member is higher than the melting point of the material forming the internal electrode, and the melting point of the material forming the internal electrode is higher than the temperature at which the ceramic laminate is baked; therefore, the electroconductive member has the contraction percentage in baking smaller than that of the internal electrode. Therefore, for the same reason as in the case of the aforementioned multilayer ceramic device, this method for manufacturing the multilayer ceramic device enables achievement of secure electric connection through the electroconductive member in the through hole and reduction in the thickness of the internal electrode during manufacturing.

The Inventors repeatedly conducted elaborate research in order to achieve the above object, and found that the breakage of electric connection through the electroconductive member in the through hole during manufacturing of the ceramic device was caused by the difference of contraction percentages in baking between the ceramic source bodies intended for the ceramic layers, and the electroconductive member in the through hole. The electroconductive member in the through hole has the contraction percentage in baking larger than that of the ceramic source bodies intended for the ceramic layers. For this reason, the electroconductive member could deviate to one side in the through hole or break apart on the way during baking, so as to cause disconnection or breakage of electric connection through the electroconductive member in the through hole. This disconnection trouble is caused in such a way that the electroconductive member contracts faster than the ceramic source bodies during baking to be pulled by the internal electrode. For this reason, the disconnection trouble can be suppressed by increasing the thickness of the internal electrode so as to make the electroconductive member less likely to be pulled by the internal electrode during the baking, but the increase of the thickness of the internal electrode is not preferred because it impedes the reduction in the thickness of the multilayer ceramic device. The Inventors conducted further research on the basis of this expertise, and accomplished the present invention.

Namely, a multilayer ceramic device according to the present invention is a ceramic device comprising: a ceramic layer; an internal electrode formed on the ceramic layer; and an electroconductive member (also referred to as a "feed-through electrode") set in a through hole formed in the ceramic layer and connected to the internal electrode, wherein the electroconductive member has a contraction percentage in baking smaller than that of the internal electrode.

In this multilayer ceramic device, the contraction percentage in baking of the electroconductive member is smaller than that of the internal electrode. This suppresses contraction of the electroconductive member in baking, so as to decrease the difference of contraction percentages in baking between the ceramic source body intended for the ceramic layer, and the electroconductive member in the through hole.

As a result, it prevents the electroconductive member from deviating to one side in the through hole or from breaking apart on the way during baking, and thus suppresses the disconnection trouble or breakage of the electric connection through the electroconductive member in the through hole. Since this multilayer ceramic device eliminates the need for provision of the thick internal electrode in order to suppress the disconnection trouble in the through hole during the baking, it becomes feasible to achieve reduction in the thickness of the internal electrode. Since the internal electrode has the contraction percentage in baking larger than that of the electroconductive member, the contraction of the internal electrode is not significantly impeded, whereby the internal electrode can be made thinner by baking. Therefore, this multilayer ceramic device enables achievement of secure electric connection through the electroconductive member in the through hole and reduction in the thickness of the internal electrode during manufacturing.

The ceramic device according to the present invention may be characterized in that each of the electroconductive member and the internal electrode contains an electroconductive material, and a ceramic material having a contraction percentage in baking smaller than that of the electroconductive material, and in that a content of the ceramic material in the electroconductive member is higher than a content of the ceramic material in the internal electrode.

Since the contraction percentage in baking of the ceramic material is smaller than the contraction percentage of the electroconductive material, the contraction percentage of the electroconductive member can be made smaller than the contraction percentage of the internal electrode, by setting the content of the ceramic material in the electroconductive member higher than the content of the ceramic material in the internal electrode.

The ceramic device according to the present invention may be characterized in that the ceramic material is the same as a ceramic material forming the ceramic layer. This configuration decreases the difference of contraction percentages in baking between the ceramic layer and the electroconductive member in the through hole.

The ceramic device according to the present invention may be characterized in that a plurality of ceramic layers and internal electrodes are alternately stacked. This configuration provides the ceramic device in the multilayer structure.

Another ceramic device according to the present invention is a ceramic device comprising a ceramic layer; an internal electrode formed on the ceramic layer; and an electroconductive member set in a through hole formed in the ceramic layer and connected to the internal electrode, wherein the electroconductive member contains an electroconductive material, and a ceramic material having a contraction percentage in baking smaller than that of the electroconductive material.

In this ceramic device, the electroconductive member contains the electroconductive material and the ceramic material, whereby the electroconductive member has the contraction percentage in baking smaller than in the case without the ceramic material. Therefore, it results in making small the difference of contraction percentages in baking between the ceramic source body intended for the ceramic layer, and the electroconductive member in the through hole. In consequence, it prevents the electroconductive member from deviating to one side in the through hole or from breaking apart on the way during baking, and it thus suppresses the disconnection trouble or breakage of the electric connection through the electroconductive member in the through hole. Since this multilayer ceramic device eliminates the need for provision of the thick internal electrode in order to suppress the disconnection trouble in the through hole in baking, it becomes feasible to achieve the reduction in the thickness of the internal electrode. Since the content of the ceramic material in the internal electrode is smaller than that in the electroconductive member, the contraction percentage of the internal electrode in baking is larger than that of the electroconductive member, whereby the contraction of the internal electrode is not significantly impeded, so as to make the internal electrode thinner by baking. Therefore, the multilayer ceramic device enables achievement of secure electric connection through the electroconductive member in the through hole and reduction in the thickness of the internal electrode during manufacturing.

DESCRIPTION OF THE PREFERRED EMBODIMENTS

Multilayer piezoelectric devices and methods for manufacturing the same as preferred embodiments of the present invention will be described below in detail with reference to the drawings. Identical or equivalent portions will be denoted by the same reference symbols in the description hereinafter, without redundant description.

First Embodiment

Figure 1:
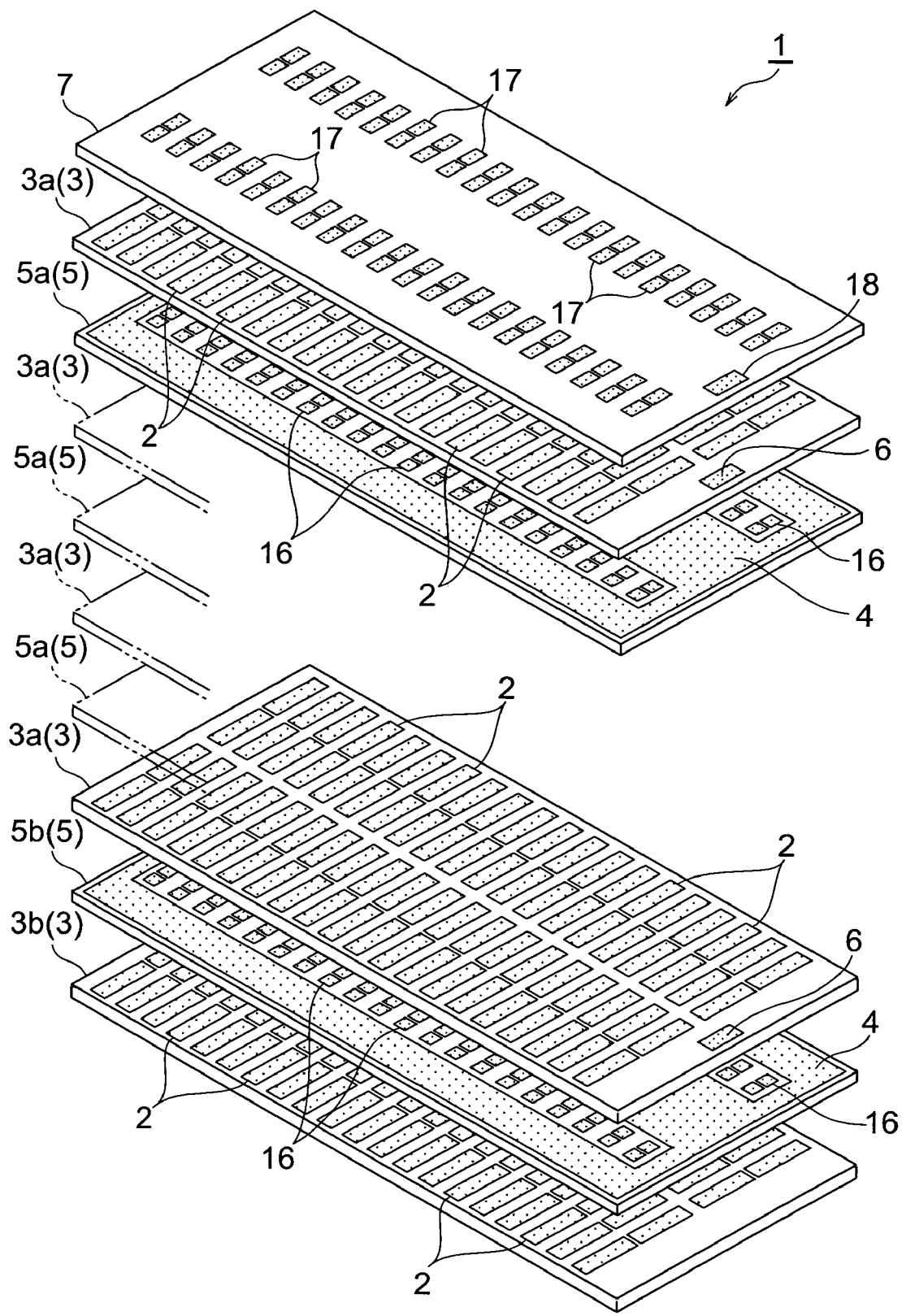
FIG. 1 is an exploded perspective view of a multilayer piezoelectric device as an embodiment of the multilayer ceramic device according to the present invention.

As shown in FIG. 1, the multilayer piezoelectric device (multilayer ceramic device) 1 of the first embodiment is constructed in a configuration wherein piezoelectric layers (ceramic layers) 3 with individual electrodes (internal electrodes) 2, and piezoelectric layers (ceramic layers) 5 with a common electrode (internal electrode) 4 are alternately stacked and wherein a piezoelectric layer (ceramic layer) 7 with terminal electrodes 17, 18 is further stacked as the uppermost layer.

Each of the piezoelectric layers 3, 5, and 7 is made of a material consisting primarily of a ceramic such as lead zirconate titanate and is formed, for example, in a rectangular thin plate shape of "10 mm×30 mm, and 30 µm thick." The individual electrodes 2 and common electrodes 4 are made of an electroconductive material consisting primarily of Ag and Pd, and are formed in a pattern by screen printing. This also applies to each of electrodes described below, except for terminal electrodes 17, 18.

Figure 2:
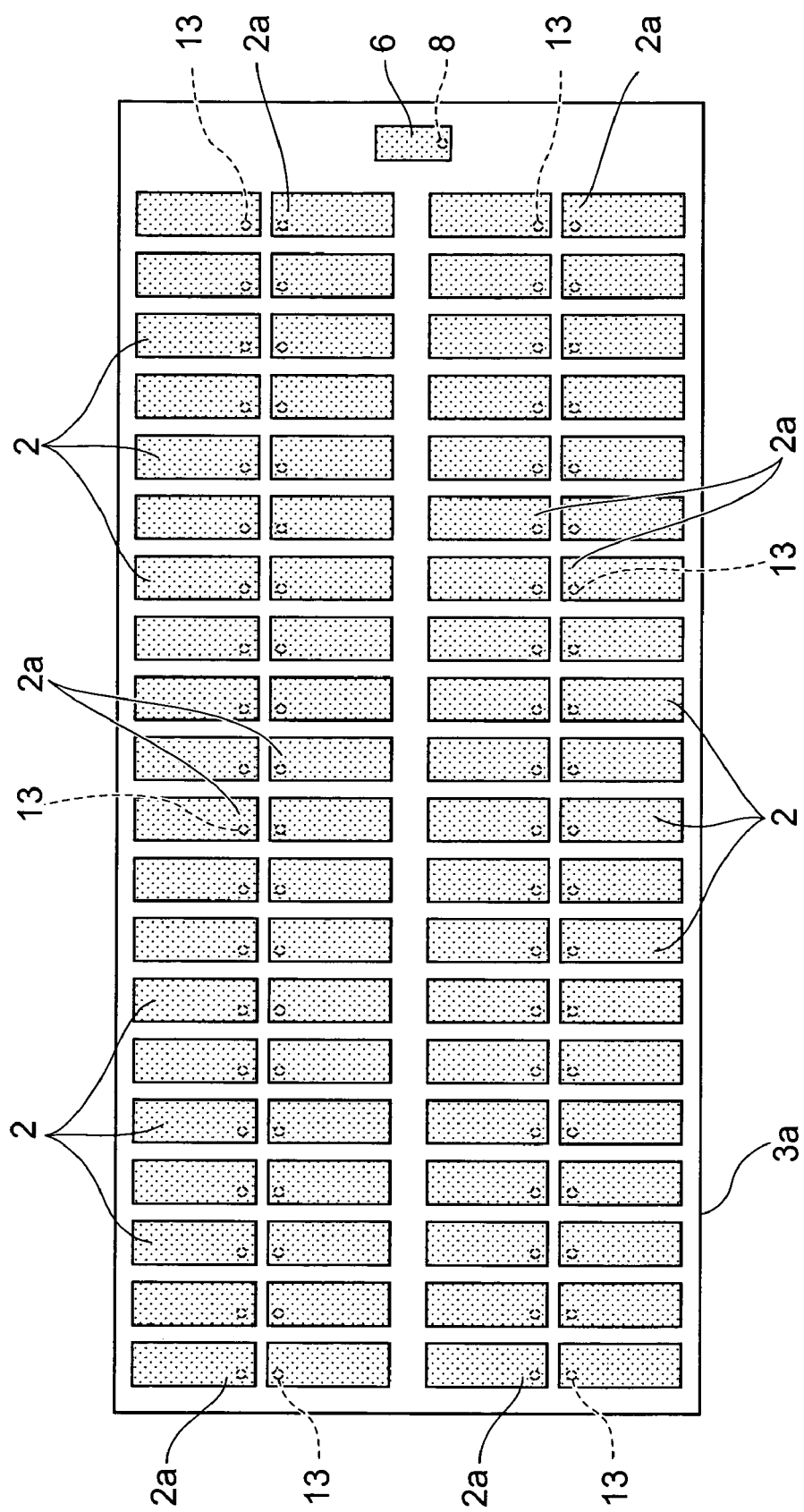
FIG. 2 is a plan view of piezoelectric layers of the second layer, fourth layer, sixth layer, and eighth layer in the multilayer piezoelectric device shown in FIG. 1.

A plurality of individual electrodes 2 of rectangular shape are arranged in a matrix, as shown in FIG. 2, on an upper surface of each of the second, fourth, sixth, and eighth piezoelectric layers 3a as counted from the uppermost piezoelectric layer 7. Each individual electrode 2 is arranged so that the longitudinal direction thereof is perpendicular to the longitudinal direction of piezoelectric layer 3a, and adjacent individual electrodes 2, 2 are spaced at a predetermined interval so as to achieve electric independence and to be prevented from being affected by each other's vibration.

Let us define herein the longitudinal direction of piezoelectric layers 3a as a row direction and the direction perpendicular to the longitudinal direction, as a column direction. Then the individual electrodes 2 are arranged, for example, in a matrix of four rows and seventy five columns (the drawings show the matrix of four rows and twenty columns for clarity). By arranging the plurality of individual electrodes 2 in the matrix in this manner, it becomes feasible to efficiently arrange the individual electrodes on the piezoelectric layers 3a, and it is thus feasible to achieve size reduction of multilayer piezoelectric device 1 or high integration of individual electrodes 2, while maintaining the area of active parts contributing to vibration in the piezoelectric layers 3a.

The individual electrodes 2 in the first row and in the second row have their respective connection ends 2a as opposed ends between the first row and the second row, and are connected to respective electroconductive members in through holes 13 formed immediately below the connection ends 2a and in the piezoelectric layer 3a. Similarly, the individual electrodes 2 in the third row and in the fourth row have their respective connection ends 2a as opposed ends between the third row and the fourth row, and are connected to respective electroconductive members in through holes 13 formed immediately below the connection ends 2a and in the piezoelectric layer 3a.

Furthermore, a relay electrode (internal electrode) 6 for electrically connecting common electrodes 4 on piezoelectric layers 5 located up and down is formed in an edge region on the upper surface of each piezoelectric layer 3a. This relay electrode 6 is connected to an electroconductive member in a through hole 8 formed immediately below it and in the piezoelectric layer 3a.

Figure 3:
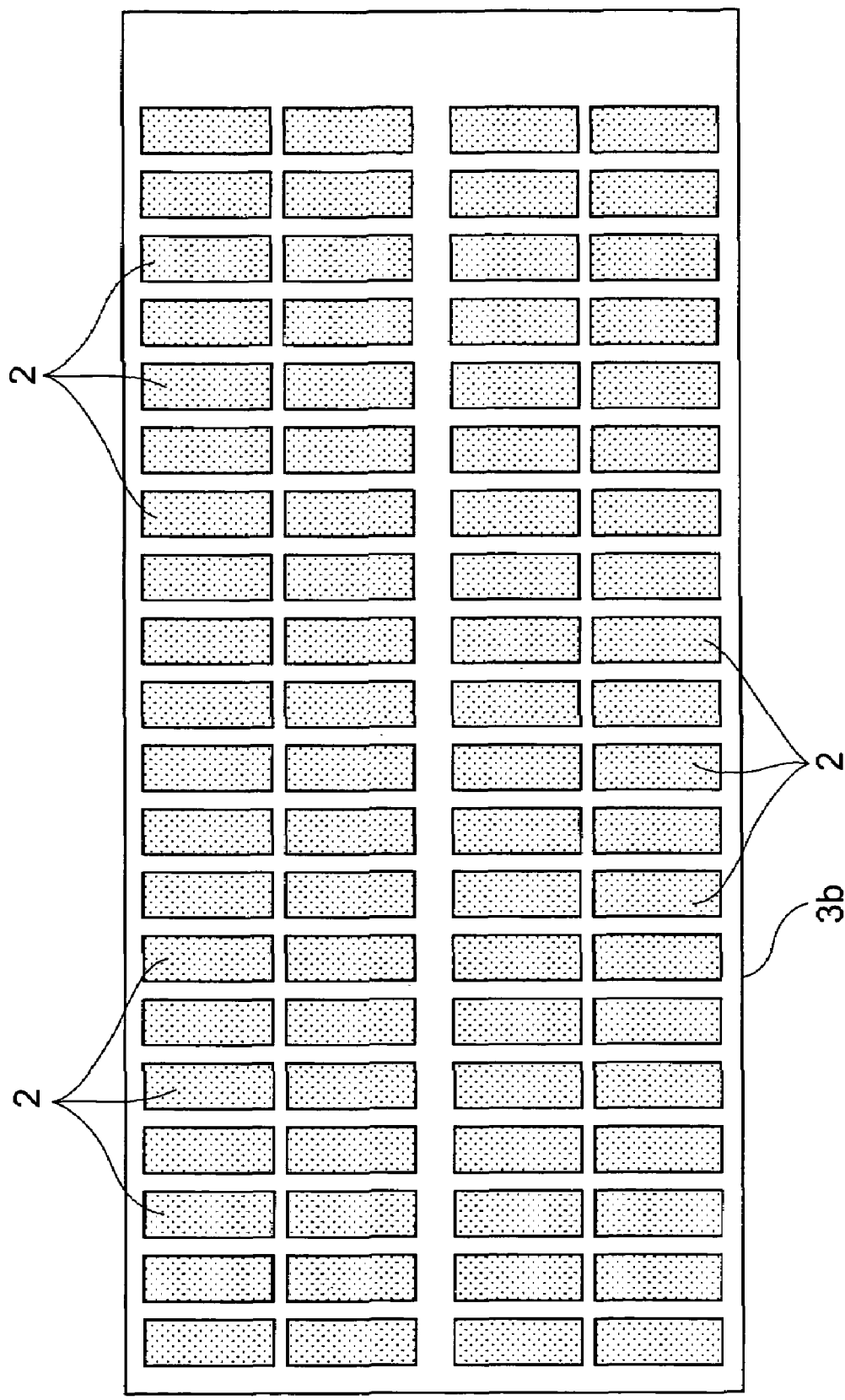
FIG. 3 is a plan view of a piezoelectric layer of the lowermost layer in the multilayer piezoelectric device shown in FIG. 1.

Individual electrodes 2 are also arranged similarly in a matrix on the upper surface of the lowermost piezoelectric layer 3b, as in the case of the second, fourth, sixth, and eighth piezoelectric layers 3a. However, as shown in FIG. 3, the lowermost piezoelectric layer 3b is different from the piezoelectric layers 3a in that the lowermost piezoelectric layer 3b has neither of the relay electrode 6 and the through holes 8, 13.

Figure 4:
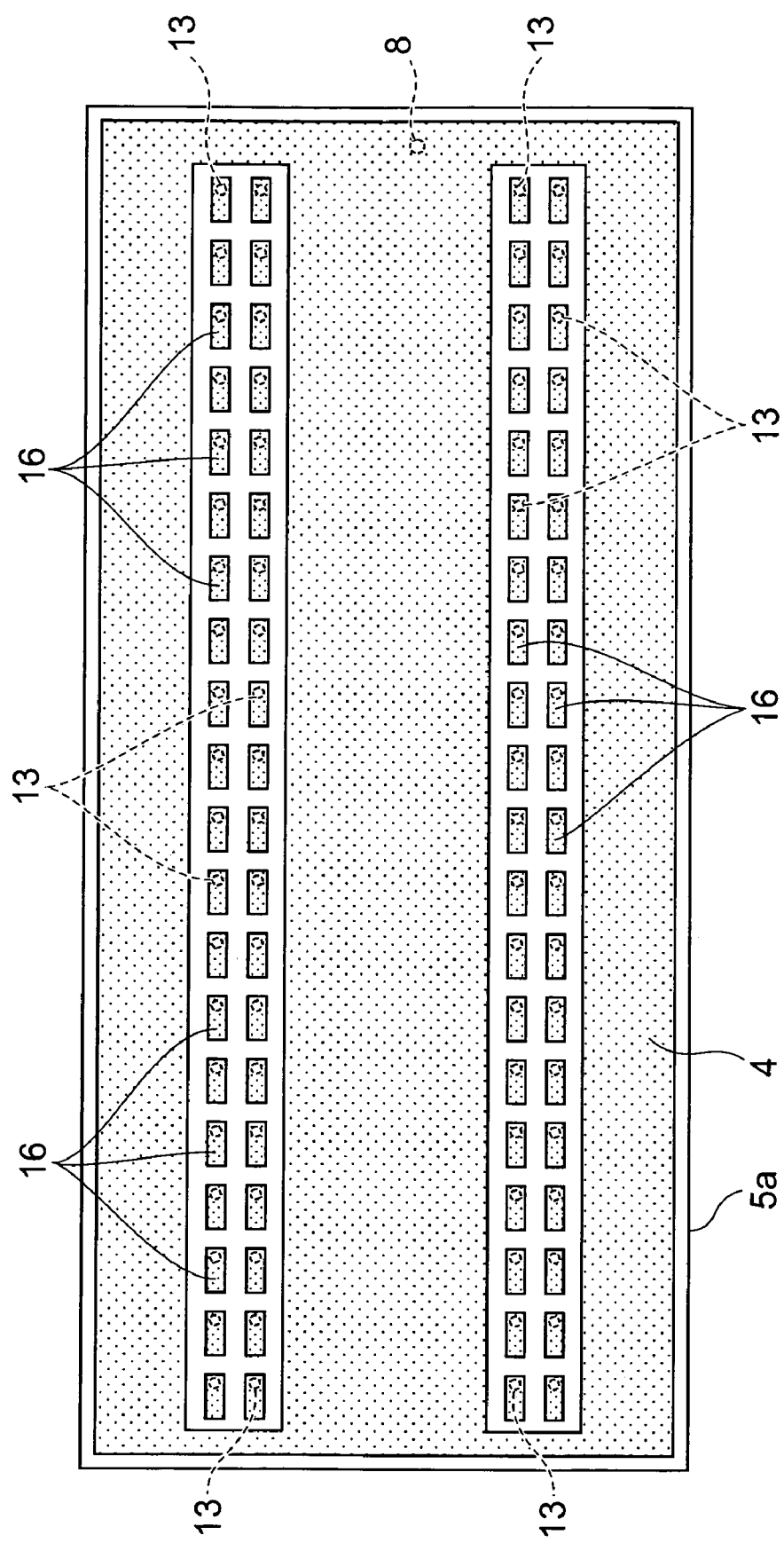
FIG. 4 is a plan view of piezoelectric layers of the third layer, fifth layer, and seventh layer in the multilayer piezoelectric device shown in FIG. 1.

As shown in FIG. 4, relay electrodes (internal electrodes) 16 are formed so as to face respective connection ends 2a on the piezoelectric layers 3a in the stack direction of multilayer piezoelectric device 1 (in other words, in the thickness direction of multilayer piezoelectric device 1, i.e., in the thickness direction of piezoelectric layers 3, 5), on an upper surface of each of the third, fifth, and seventh piezoelectric layers 5a as counted from the uppermost piezoelectric layer 7. Each relay electrode 16 is connected to an electroconductive member in a through hole 13 formed immediately below it and in the piezoelectric layer 5.

Furthermore, a common electrode 4 is formed on the upper surface of each piezoelectric layer 5a. This common electrode 4 surrounds each of a set of relay electrodes 16 in the first row and in the second row and a set of relay electrodes 16 in the third row and in the fourth row with a predetermined clearance thereto, and overlaps with the portion other than the connection end 2a of each individual electrode 2, when viewed from the stack direction. This permits the entire portions opposed to the portions other than the connection ends 2a of the respective individual electrodes 2 in the piezoelectric layers 3, 5 to be effectively used as active parts contributing to vibration. The common electrode 4 is formed with a predetermined clearance from the outer periphery of piezoelectric layer 5a and is connected to an electroconductive member in a through hole 8 formed in the piezoelectric layer 5 so as to face the relay electrode 6 on the piezoelectric layer 3a in the stack direction.

Figure 5:
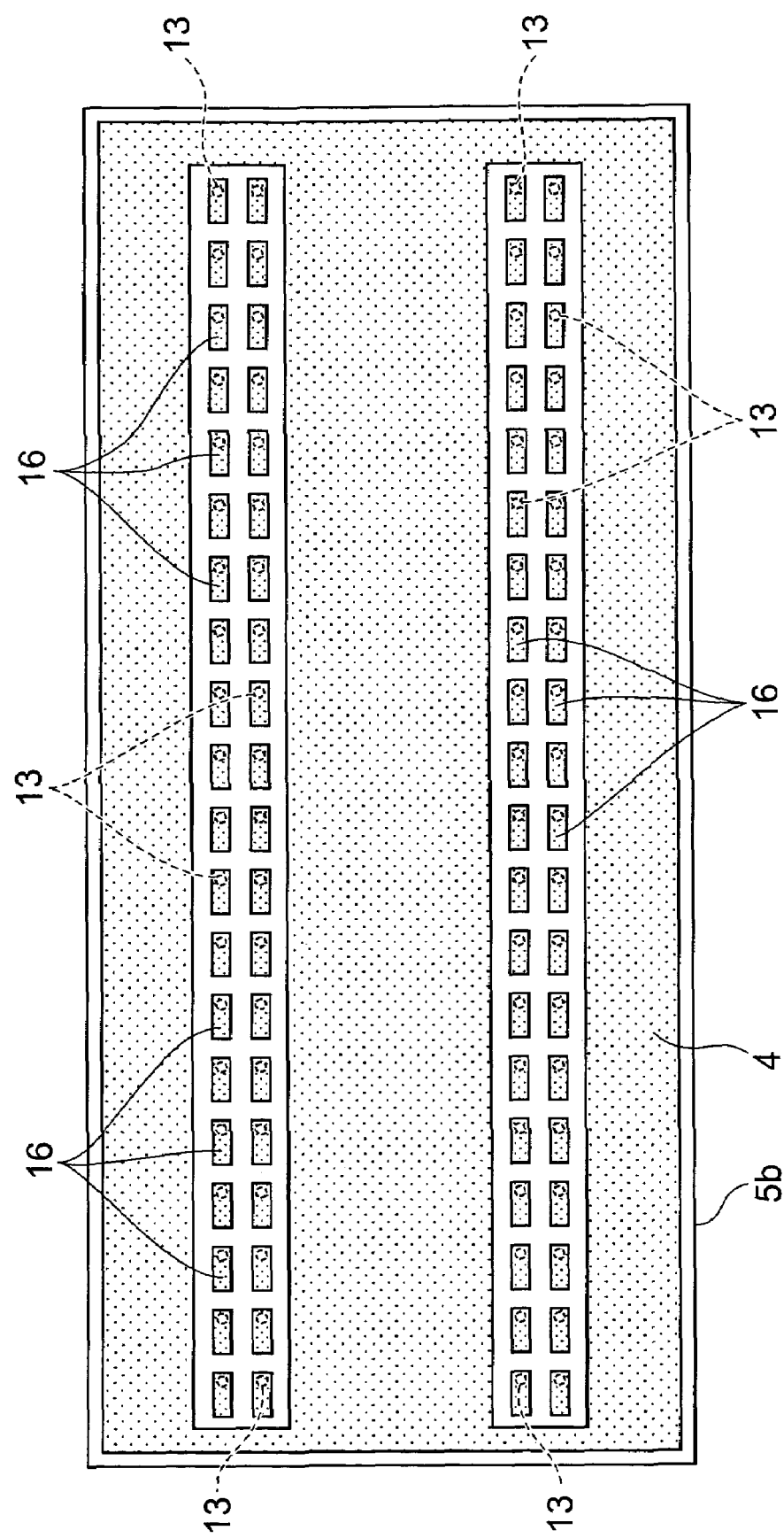
FIG. 5 is a plan view of a piezoelectric layer of the ninth layer in the multilayer piezoelectric device shown in FIG. 1.

The relay electrodes 16 and common electrode 4 are also formed similarly on the upper surface of the ninth piezoelectric layer 5b, as in the case of the above-described third, fifth, and seventh piezoelectric layers 5a. However, as shown in FIG. 5, the ninth piezoelectric layer 5b is different from the piezoelectric layers 5a in that it has no through hole 8.

Figure 6:
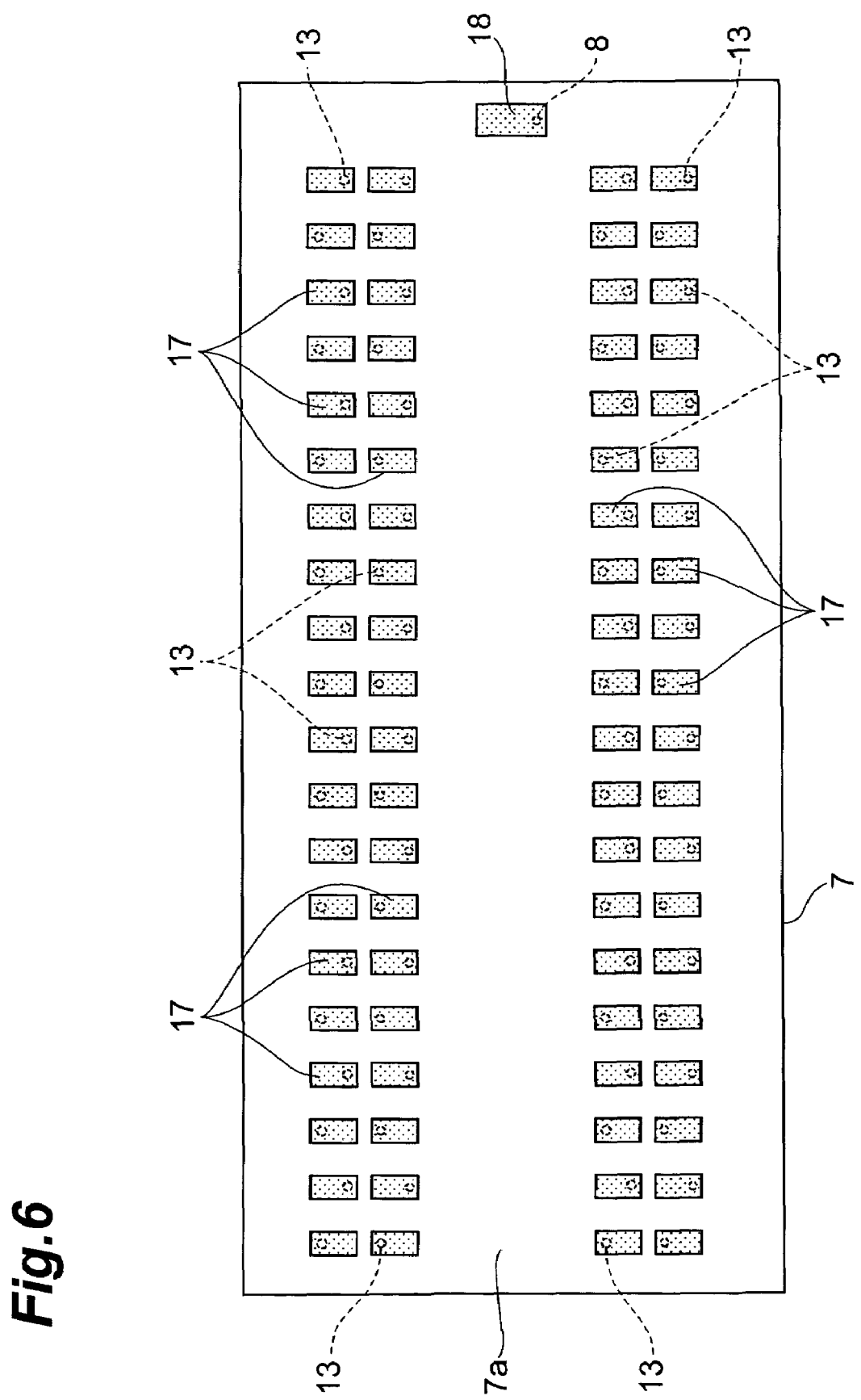
FIG. 6 is a plan view of a piezoelectric layer of the uppermost layer in the multilayer piezoelectric device shown in FIG. 1.

On the upper surface of the uppermost piezoelectric layer 7, as shown in FIG. 6, terminal electrodes 17 are formed so as to face the connection ends 2a of the respective individual electrodes 2 on the piezoelectric layer 3a in the stack direction, and a terminal electrode 18 is formed so as to face the relay electrode 6 on the piezoelectric layer 3a in the stack direction. Each terminal electrode 17 is connected to an electroconductive member in a through hole 13 formed immediately below it and in the piezoelectric layer 7, and the terminal electrode 18 is connected to an electroconductive member in a through hole 8 formed immediately below it and in the piezoelectric layer 7.

Lead wires of FPC (flexible printed circuit board) or the like for connection to a drive power supply are soldered to these terminal electrodes 17, 18. For this reason, in order to facilitate placement of solder in soldering of the lead wires, the terminal electrodes 17, 18 are formed in such structure that a surface electrode layer of an electroconductive material consisting primarily of Ag for improvement in solder wettability is placed on a ground electrode layer of an electroconductive material consisting primarily of Ag and Pd.

Figure 7:
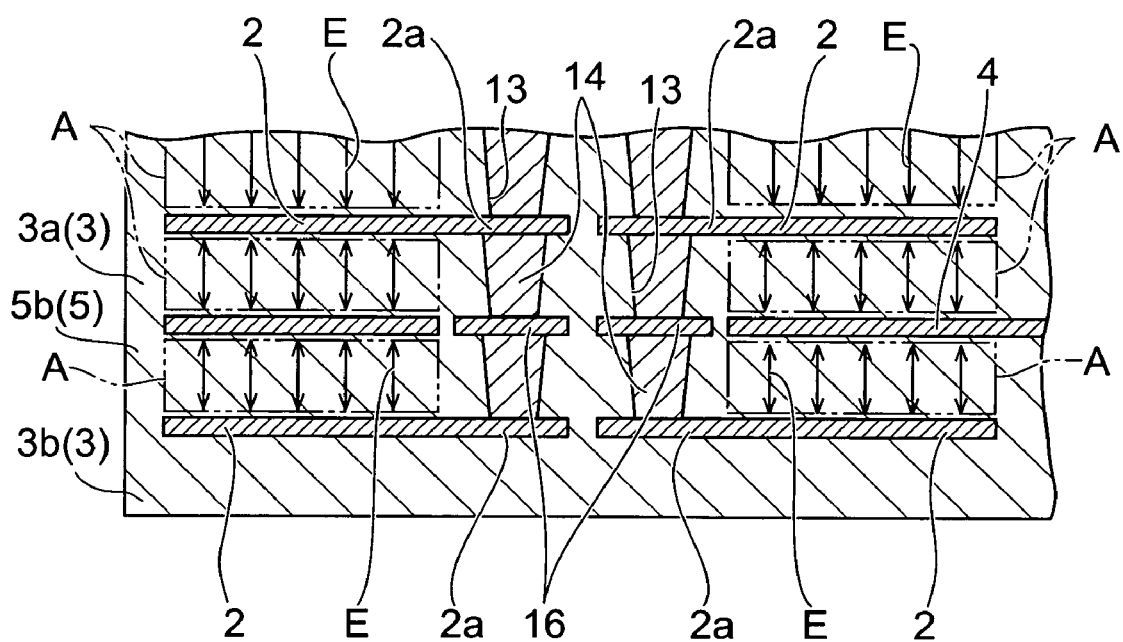
FIG. 7 is an enlarged partial sectional view normal to the longitudinal direction of the multilayer piezoelectric device shown in FIG. 1.

In the stack structure of piezoelectric layers 3, 5, 7 with the electrode patterns formed as described above, five individual electrodes 2 are aligned in the stack direction with relay electrode 16 in between, with respect to each terminal electrode 17 on the uppermost layer, and each of the electrodes 2, 16, 17 thus aligned is electrically connected through the electroconductive member 14 in the through hole 13, as shown in FIG. 7. On the other hand, with respect to the terminal electrode 18 on the uppermost layer, four common electrodes 4 are aligned in the stack direction with relay electrode 6 in between, and each of the electrodes 4, 6, 18 thus aligned is electrically connected through the electroconductive member 14 in the through hole 8.

The electroconductive members 14 in the through holes 8, 13 are made of an electroconductive material consisting primarily of Ag and Pd. Adjacent through holes 13, 13 in the stack direction are formed in the respective piezoelectric layers 3, 5, 7 so that their center axes deviate from each other, so as to achieve secure electric connection through the electroconductive members 14 in the through holes 13. This also applies similarly to through holes 8, 8 adjacent in the stack direction.

In this electric connection in the multilayer piezoelectric device 1, when a voltage is applied between a predetermined terminal electrode 17 and the terminal electrode 18, the voltage is applied between the individual electrodes 2 aligned under the predetermined terminal electrode 17, and the common electrodes 4. This results in creating electric fields E in the portions sandwiched between the individual electrodes 2 and the common electrodes 4, as shown in FIG. 7, in the piezoelectric layers 3, 5 and thus displacing the pertinent portions as active parts A. By selecting the terminal electrode 17 to which the voltage is applied, the active parts A aligned under the selected terminal electrode 17 can be displaced in the stack direction among the active parts A corresponding to the respective individual electrodes 2 arranged in the matrix. The multilayer piezoelectric device 1 of this configuration is applied to a drive source of various devices requiring microscopic displacement, such as control of a valve in a micropump.

Next, a method for manufacturing the multilayer piezoelectric device 1 according to the first embodiment will be described. First, an organic binder, an organic solvent, etc. are mixed in a piezoelectric ceramic material consisting primarily of lead zirconate titanate, to prepare a source paste, and this source paste is used to form green sheets (ceramic source bodies) intended for the respective piezoelectric layers 3, 5, 7. A laser beam is then projected to predetermined positions on the green sheets for the respective piezoelectric layers 3, 5, 7 to form the through holes 8, 13.

Subsequently, an organic binder, an organic solvent, etc. are mixed in a metal material made in the proportion of Pd:20 to Ag:80, to prepare an electroconductive paste, and this electroconductive paste is used to perform filling screen printing in the through holes 8, 13, thereby placing the electroconductive members 14 in the through holes 8, 13.

Thereafter, an organic binder, an organic solvent, etc. are mixed in a metal material made in the proportion of Pd:15 to Ag:85, to prepare an electroconductive paste, and this electroconductive paste is used to perform screen printing on the green sheets for the respective piezoelectric layers 3, 5, thereby forming the internal electrodes 2, 4, 6, 16. The same electroconductive paste is used to perform screen printing on the green sheet for the uppermost piezoelectric layer 7, to form the ground electrode layers for the terminal electrodes 17, 18.

In the case where the electroconductive members 14 and internal electrodes 2, 4, 6, 16 (hereinafter referred to as "internal electrodes 2 and others") are made each of the electroconductive material consisting primarily of Ag and Pd, while the proportion of Pd in the electroconductive material forming the internal electrodes 2 and others is a "proportion of Pd:X to Ag:(100−X)," the proportion of Pd in the electroconductive material forming the electroconductive members 14 is preferably a "proportion of Pd:(X+3 to 30) to Ag:[100−(X+3 to 30)]" (more preferably, a "proportion of Pd:(X+5 to 15) to Ag:[100−(X+5 to 15)]").

Subsequently, the green sheets with the electrode patterns formed thereon are stacked in the aforementioned order and pressed in the stack direction to prepare a green laminate. Then this green laminate is cut in a predetermined size, the green laminate thus cut is degreased under the conditions of 400° C. and ten hours, and then the green laminate is baked under the conditions of 1000° C. and two hours.

Subsequently, the surface electrode layer of the electroconductive material consisting primarily of Ag is baked on the ground electrode layers formed on the sintered sheet for the piezoelectric layer 7, to form the terminal electrodes 17, 18. The material of the surface electrode layer may be Au, Cu, or the like. The surface electrode layer may be formed by adopting such a method as sputtering or electroless plating. Lastly, a polarization process is carried out to complete the multilayer piezoelectric device 1.

In the multilayer piezoelectric device 1 and the method for manufacturing the same according to the first embodiment, as described above, the electroconductive members 14 and the internal electrodes 2 and others are made each of the electroconductive material consisting primarily of Ag and Pd, and the proportion of Pd in the electroconductive material forming the electroconductive members 14 (the proportion of Pd:20 to Ag:80) is higher than the proportion of Pd in the electroconductive material forming the internal electrodes 2 and others (the proportion of Pd:15 to Ag:85). In this case, the melting point of the electroconductive material forming the electroconductive members 14 is higher than the melting point of the electroconductive material forming the internal electrodes 2 and others. This is because the melting point of Pd is higher than that of Ag.

Since the melting point of the electroconductive material forming the electroconductive members 14 is higher than that of the electroconductive material forming the internal electrodes 2 and others as described above, the electroconductive members 14 have the contraction percentage in baking smaller than that of the internal electrodes 2 and others.

This results in relatively constricting the contraction of the electroconductive members 14 in baking, so as to decrease the difference of contraction percentages in baking between the green sheets for the piezoelectric layers 3, 5, 7 and the electroconductive members 14 in the through holes 8, 13. As a result, it prevents the electroconductive members 14 from deviating to one side in the through holes 8, 13 or from breaking apart on the way during baking, and thus it prevents the breakage of electric connection through the electroconductive members 14 in the through holes 8, 13. Therefore, it is feasible to improve the certainty of electric connection through the electroconductive members 14 in the through holes 8, 13 in manufacturing.

On the other hand, the contraction of the internal electrodes 2 and others is relatively promoted during the baking, whereby the internal electrodes 2 and others are made thinner by baking. This reduction in the thickness of the internal electrodes 2 and others contributes to size reduction of the multilayer piezoelectric device 1. Furthermore, the reduction in the thickness of the individual electrodes 2 and common electrodes 4 is effective particularly to improvement in flexibility of displacement in the stack direction of active parts A.

The melting point of the electroconductive material forming the internal electrodes 2 and others is lower than that of the electroconductive material forming the electroconductive members 14, but is higher than the temperature for baking of the green laminate (1000° C.). This is because the electroconductive material forming the internal electrodes 2 and others also contains Pd in addition to Ag.

The following will describe the evaluation results of multilayer piezoelectric devices of Example and multilayer piezoelectric devices of Comparative Example. The multilayer piezoelectric devices of Example were prepared by the method for manufacturing the multilayer piezoelectric device 1 according to the first embodiment as described above. On the other hand, the multilayer piezoelectric devices of Comparative Example are different from the multilayer piezoelectric devices of Example in that the proportion of Pd in the electroconductive material forming the electroconductive members in the through holes is equal to the proportion of Pd in the electroconductive material forming the internal electrodes (the proportion of Pd:15 to Ag:85).

The evaluation was conducted as follows. Namely, the capacitance (between each terminal electrode on the individual electrode side and the terminal electrode on the common electrode side) was measured with an LCR meter and at 300 spots per device for each of the prepared multilayer piezoelectric devices. A multilayer piezoelectric device with which the capacitance was below a predetermined capacitance value even at one spot was defined as a defective device, on the assumption that there occurred breakage of electric connection through the electroconductive member in the through hole.

As a result, the multilayer piezoelectric devices of Example included no defective device out of the hundred devices, whereas the multilayer piezoelectric devices of Comparative Example included seventeen defective devices out of the hundred devices. This proved the effect of the multilayer piezoelectric device 1 and the method for manufacturing the same according to the first embodiment, i.e., the improvement in the certainty of electric connection through the electroconductive members in the through holes during manufacturing.

Second Embodiment

The multilayer piezoelectric device (ceramic device) 1 according to the second embodiment is different in the material of the internal electrodes 2 and others and the material of the electroconductive members 14 from the multilayer piezoelectric device 1 of the first embodiment.

Namely, in the multilayer piezoelectric device 1 of the second embodiment, the individual electrodes 2 and common electrodes 4 are made of a material in which a common material is mixed in a metal material (electroconductive material), and thus have electric conductivity. This metal material consists primarily of Ag and Pd, and the common material is the same ceramic material as the material forming the piezoelectric layers 3, 5, 7. The content of the common material in the individual electrodes 2 and the common electrodes 4, as a mass percentage relative to the metal material, is, for example, 20% by mass relative to the metal material.

The electroconductive members 14 in the through holes 8, 13 are made of a material in which a common material is mixed in a metal material, and thus have electric conductivity. This metal material consists primarily of Ag and Pd; and the common material is the same ceramic material as the material forming the piezoelectric layers 3, 5, 7. The content of the common material in the electroconductive members 14 is higher than the content thereof in the individual electrodes 2 and common electrodes 4. The content of the common material in the electroconductive members 14, as a mass percentage relative to the metal material, is, for example, 30% by mass relative to the metal material.

Suppose the content of the common material in the individual electrodes 2 and the common electrodes 4 is X % by mass relative to the metal material and the content of the common material in the electroconductive members 14 is Y % by mass relative to the metal material. Then the value of Y-X is preferably in the range of 5 to 60% by mass (more preferably, 10 to 50% by mass). The reason for it is as follows. If the value of Y-X is less than 5% by mass, the contraction percentage in baking of the electroconductive members 14 will not be small enough. If it exceeds 60% by mass, there could occur failure in connection because of the too large amount of the common material in the electroconductive members 14.

Next, a method for manufacturing the multilayer piezoelectric device 1 according to the second embodiment will be described. First, an organic binder, an organic solvent, etc. are mixed in a piezoelectric ceramic material consisting primarily of lead zirconate titanate, to prepare a source paste, and this source paste is used to form green sheets (ceramic source bodies) for the respective piezoelectric layers 3, 5, 7. Then a laser beam is projected to predetermined positions on the green sheets for the respective piezoelectric layers 3, 5, 7 to form the through holes 8, 13.

Subsequently, filling screen printing with an electroconductive paste for through holes is performed in the through holes 8, 13 of the green sheets prepared as described above, to place the electroconductive members 14 in the through holes 8, 13. This electroconductive paste for through holes is prepared as follows. A ceramic material consisting primarily of lead zirconate titanate is added as a common material into a metal material made in the proportion of Pd:20 to Ag:80. This ceramic material is the same as the piezoelectric ceramic material used as the material of the green sheets. The content of the common material to be added is, for example, 30% by mass relative to the metal material. Furthermore, an organic binder, an organic solvent, etc. are mixed therein to obtain the electroconductive paste for through holes.

Subsequently, screen printing with an electroconductive paste for electrodes is performed on the green sheets with the electroconductive members 14 therein, to form each of the internal electrodes 2, 4, 6, 16. The electroconductive paste for electrodes is used to perform screen printing on the green sheet for the uppermost piezoelectric layer 7, to form the ground electrode layers of the terminal electrodes 17, 18. This electroconductive paste for electrodes is prepared as follows. A ceramic material consisting primarily of lead zirconate titanate is added as a common material into a metal material made in the proportion of Pd:20 to Ag:80. The ceramic material added as a common material is the same as the piezoelectric ceramic material used as the material of the green sheets. The content of the common material to be added is smaller than that in the electroconductive paste for through holes and is, for example, 20% by mass relative to the metal material. Furthermore, an organic binder, an organic solvent, etc. are mixed therein to obtain the electroconductive paste for electrodes.

Subsequently, the green sheets with the electrode patterns thereon are stacked in the aforementioned order and pressed in the stack direction to prepare a green laminate. Then this green laminate is cut in a predetermined size, the green laminate thus cut is degreased under the conditions of 400° C. and ten hours, and thereafter it is baked under the conditions of 1000° C. and two hours. Each piezoelectric layer 3, 5, 7, the electroconductive members 14, and each internal electrode 2, 4, 6, 16 contract in this baking operation, and, after baked, they become contracted at their respective contraction percentages different from each other. The contraction percentages in this baking increase with decrease in the content of the ceramic material but decrease with increase thereof. Therefore, the contraction percentages decrease in the order of each internal electrode 2, 4, 6, 16, the electroconductive members 14, and the piezoelectric layers 3, 5, 7.

Subsequently, the surface electrode layer of a material consisting primarily of Ag is baked on the ground electrode layers formed on the sintered sheet for the piezoelectric layer 7, to form the terminal electrodes 17, 18. The material of the surface electrode layer may be Au, Cu, or the like. The surface electrode layer may be formed by adopting such a method as sputtering or electroless plating. Lastly, a polarization process is carried out to complete the multilayer piezoelectric device 1.

In the multilayer piezoelectric device 1 and the method for manufacturing the same according to the second embodiment, as described above, the electroconductive members 14 and the internal electrodes 2, 4, 6, 16 (hereinafter referred to as "internal electrodes 2 and others") are made each of the material comprised of the metal material consisting primarily of Ag and Pd, and the common material, and the content of the common material in the electroconductive members 14 (30% by mass relative to the metal material) is higher than the content of the common material in the internal electrodes 2 and others (20% by mass relative to the metal material). This makes the contraction percentage of the electroconductive members 14 in baking smaller than that of the internal electrodes 2 and others. This is because the contraction percentage of the ceramic material used as a common material is smaller than the contraction percentage of the metal material. As described above, the electroconductive members 14 have the contraction percentage in baking smaller than that of the internal electrodes 2 and others.

This results in relatively constricting the contraction of the electroconductive members 14 in baking, so as to decrease the difference of contraction percentages in baking between the green sheets for the piezoelectric layers 3, 5, 7 and the electroconductive members 14 in the through holes 8, 13. As a result, it prevents the electroconductive members 14 from deviating to one side in the through holes 8, 13 or from breaking apart on the way during baking, and it thus prevents the breakage of electric connection through the electroconductive members 14 in the through holes 8, 13. Therefore, it is feasible to improve the certainty of electric connection through the electroconductive members 14 in the through holes 8, 13 during manufacturing.

In the multilayer piezoelectric device 1 and the method for manufacturing the same according to the second embodiment, there is no need for provision of thick internal electrodes 2 and others in order to prevent disconnection of electroconductive members 14 in baking, and this enables reduction in the thickness of the internal electrodes 2 and others. The content of the ceramic material in the internal electrodes 2 and others is lower than that in the electroconductive members 14, and the contraction percentage of the internal electrodes 2 and others in baking is larger than that of the electroconductive members 14; therefore, the internal electrodes 2 and others sufficiently contract to decrease their thickness in baking. The reduction in the thickness of the internal electrodes 2 and others contributes to size reduction of the multilayer piezoelectric device 1. Furthermore, the reduction in the thickness of the individual electrodes 2 and common electrodes 4 is effective particularly to improvement in flexibility of displacement in the stack direction of active parts A.

In the multilayer piezoelectric device 1 of the second embodiment, the same ceramic material as the material forming the piezoelectric layers 3, 5, 7 is used as the common material mixed in the electroconductive members 14. For this reason, the present embodiment efficiently provides the foregoing action to decrease the difference of contraction percentages in baking between the green sheets for the piezoelectric layers 3, 5, 7 and the electroconductive members 14 in the through holes 8, 13.

It is also contemplated as to the multilayer piezoelectric device of this type that the contraction percentages are made different by changing the composition ratio of the metal material (e.g., a mass ratio of Ag and Pd) in the electroconductive members 14 from that in the individual electrodes 2 and common electrodes 4. However, the multilayer piezoelectric device 1 of the second embodiment adopts the change in the contents of the common material, without need for increase in the composition ratio of expensive metal (e.g., Pd or the like), and is thus able to provide the foregoing action without increase in the cost of the piezoelectric device.

The following will describe the evaluation results of multilayer piezoelectric devices of Example and multilayer piezoelectric devices of Comparative Example. The multilayer piezoelectric devices of Example were those prepared by the method for manufacturing the multilayer piezoelectric device 1 according to the second embodiment as described above. The content of the common material in the electroconductive members in the through holes was 30% by mass relative to the metal material, and the content of the common material in the internal electrodes 20% by mass relative to the metal material. On the other hand, the multilayer piezoelectric devices of Comparative Example are different from the multilayer piezoelectric devices of Example in that the content of the common material in the electroconductive members in the through holes and the content of the common material in the internal electrodes both are 20% by mass relative to the metal material.

The evaluation was conducted as follows. Namely, the capacitance (between each terminal electrode on the individual electrode side and the terminal electrode on the common electrode side) was measured with an LCR meter and at 300 spots per device for each of the prepared multilayer piezoelectric devices. A multilayer piezoelectric device with which the capacitance was below a predetermined capacitance value even at one spot was defined as a defective device, on the assumption that there occurred breakage of electric connection through the electroconductive member in the through hole.

As a result, the multilayer piezoelectric devices of Example included no defective device out of the hundred devices, whereas the multilayer piezoelectric devices of Comparative Example included twenty one defective devices out of the hundred devices. This proved the effect of the multilayer piezoelectric device 1 and the method for manufacturing the same according to the second embodiment, i.e., improvement in the certainty of electric connection through the electroconductive members in the through holes during manufacturing.

The present invention is by no means limited to the above embodiments.

For example, in the first embodiment the materials forming the electroconductive members 14 and the internal electrodes 2 and others were the electroconductive materials consisting primarily of Ag and Pd, but the materials are not limited to them and may be any material that satisfies the condition that the melting point of the material forming the electroconductive members 14 is higher than the melting point of the material forming the internal electrodes 2 and others.

An example of such materials is a case wherein each of the electroconductive members 14 and the internal electrodes 2 and others is made of a material containing at least one of Ag and Au, and Pd and wherein the proportion of Pd in the material forming the electroconductive members 14 is higher than the proportion of Pd in the material forming the internal electrodes 2 and others. A further example is a case wherein each of the electroconductive members 14 and the internal electrodes 2 and others is made of a material containing at least one of Ag and Au, and Pt and wherein the proportion of Pt in the material forming the electroconductive members 14 is higher than the proportion of Pt in the material forming the internal electrodes 2 and others. In these cases, the melting points of Pd and Pt are also higher than the melting points of Ag and Au, and thus the melting point of the material forming the electroconductive members 14 can be made higher than that of the material forming the internal electrodes 2 and others.

In addition to the multilayer piezoelectric device 1 and the method for manufacturing the same according to the first embodiment, the present invention is also applicable to various multilayer ceramic devices consisting of a stack of ceramic layers, and the method for manufacturing the same. Such multilayer ceramic devices include, for example, multilayer capacitors, inductors, NTC, PTC, or other thermistors, varistors, and so on.

In the second embodiment the common material in the electroconductive members 14 and in the internal electrodes 2 and others was the same ceramic material as the material forming the piezoelectric layers, but, without having to be limited to this, the common material may be any other ceramic material that has a small contraction percentage in baking. The common material may also be any other material with a small contraction percentage. In the aforementioned second embodiment the contraction percentage in baking was decreased by inclusion of the common material in the electroconductive members, but the electroconductive members do not have to be limited to those containing the common material. The electroconductive members may be any electroconductive members having a contraction percentage in baking smaller than that of the individual electrodes and common electrodes.

In addition to the multilayer piezoelectric device 1 and the method for manufacturing the same according to the second embodiment, the present invention is also applicable to various multilayer ceramic devices consisting of a stack of ceramic layers, and the method for manufacturing the same. Such multilayer ceramic devices include, for example, multilayer capacitors, inductors, NTC, PTC, or other thermistors, varistors, and so on. The present invention is not applicable only to the multilayer ceramic devices, but is also applicable to single-layer type piezoelectric devices with through holes, and single-layer type ceramic devices such as capacitors, inductors, NTC, PTC, or other thermistors, and varistors.

As described above, the present invention enables achievement of secure electric connection through the electroconductive members in the through holes and reduction in the thickness of the internal electrodes during manufacturing.

What is claimed is:

1. A multilayer ceramic device comprising a stack of ceramic layers, the multilayer ceramic device comprising:
    an electroconductive member set in through holes formed in the ceramic layers; and
    an internal electrode formed between the ceramic layers adjacent to each other, said internal electrode is connected to the electroconductive member,
    wherein a melting point of a material forming the electroconductive member is higher than a melting point of a material forming the internal electrode, both the electroconductive member and the internal electrode are made of a palladium based or a platinum based material.

2. The multilayer ceramic device according to claim 1, wherein each of the electroconductive member and the internal electrode is made of palladium and a material containing at least one of silver and gold, and
wherein a proportion of palladium in the material forming the electroconductive member is higher than a proportion of palladium in the material forming the internal electrode.

3. The multilayer ceramic device according to claim 1, wherein each of the electroconductive member and the internal electrode is made of platinum and a material containing at least one of silver and gold, and
wherein a proportion of platinum in the material forming the electroconductive member is higher than a proportion of platinum in the material forming the internal electrode.

4. A ceramic device comprising:
a ceramic layer;
an internal electrode formed on the ceramic layer; and
an electroconductive member set in through holes formed in the ceramic layer and connected to the internal electrode,
wherein the electroconductive member has a contraction percentage in baking smaller than that of the internal electrode, and
wherein both the electroconductive member and the internal electrode are made of a palladium based or a platinum based material.

5. The ceramic device according to claim 4, wherein a plurality of said ceramic layers and said internal electrodes are alternately stacked.

6. The ceramic device according to claim 4, wherein each of the electroconductive member and the internal electrode contains an electroconductive material and a ceramic material,
the contraction percentage in baking being smaller for the ceramic material than for the electroconductive material, and
wherein a content of the ceramic material in the electroconductive member is higher than a content of the ceramic material in the internal electrode.

7. The ceramic device according to claim 6, wherein the ceramic material is the same as a ceramic material forming the ceramic layer.

8. The ceramic device according to claim 7, wherein a plurality of said ceramic layers and said internal electrodes are alternately stacked.

9. The ceramic device according to claim 6, wherein a plurality of said ceramic layers and said internal electrodes are alternately stacked.

10. A ceramic device comprising:
a ceramic layer;
an internal electrode formed on the ceramic layer; and
an electroconductive member set in through holes formed in the ceramic layer and connected to the internal electrode,
wherein the electroconductive member contains an electroconductive material and a ceramic material, a contraction percentage in baking being smaller for the ceramic material than for the electroconductive material, and
wherein both the electroconductive member and the internal electrode are made of a palladium based or a platinum based material.

11. A method for manufacturing a multilayer ceramic device comprising a stack of ceramic layers, the method comprising:
setting an electroconductive member in through holes formed in a ceramic source body intended for the stack of ceramic layers, and forming an internal electrode on a surface of the ceramic source body;
stacking a plurality of such ceramic source bodies each with the electroconductive member set therein and with the internal electrode formed thereon, to form the stack of ceramic layers, the internal electrode being between the ceramic layers adjacent to each other; and
baking the stacked ceramic layers;
wherein a melting point of a material forming the electroconductive member is higher than a melting point of a material forming the internal electrode,
wherein the melting point of the material forming the internal electrode is higher than a temperature at which the stacked ceramic layers are baked, and
wherein both the electroconductive member and the internal electrode are made of a palladium based or a platinum based material.

* * * * *